United States Patent
Johnson et al.

(10) Patent No.: US 6,951,981 B2
(45) Date of Patent: Oct. 4, 2005

(54) ASYMMETRIC TRANSFER MOLDING METHOD AND AN ASYMMETRIC ENCAPSULATION MADE THEREFROM

(75) Inventors: Mark S. Johnson, Boise, ID (US); Todd O. Bolken, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 83 days.

(21) Appl. No.: 10/321,977

(22) Filed: Dec. 17, 2002

(65) Prior Publication Data

US 2003/0086994 A1 May 8, 2003

Related U.S. Application Data

(60) Continuation of application No. 09/388,045, filed on Sep. 1, 1999, now Pat. No. 6,605,331, which is a division of application No. 09/255,554, filed on Feb. 22, 1999, now Pat. No. 6,143,581.

(51) Int. Cl.[7] ............................................. H01L 23/28
(52) U.S. Cl. .................. 174/52.2; 438/112; 438/124
(58) Field of Search ............................. 174/52.1, 52.2, 174/52.3, 52.4; 438/22, 23, 26, 28, 106, 112, 124, 125, 126, 127; 257/678, 787

(56) References Cited

U.S. PATENT DOCUMENTS

| | | |
|---|---|---|
| 4,744,637 A | 5/1988 | Sekimura et al. |
| 4,868,349 A * | 9/1989 | Chia ........................ 174/52.4 |
| 5,070,041 A | 12/1991 | Katayama et al. |
| 5,270,573 A | 12/1993 | Takayanagi et al. |
| 5,609,889 A | 3/1997 | Weber |
| 5,635,220 A | 6/1997 | Izumi et al. |
| 5,766,987 A | 6/1998 | Mitchell et al. |
| 5,853,771 A | 12/1998 | Matsumoto |
| 5,874,324 A | 2/1999 | Osada |
| 6,241,153 B1 * | 6/2001 | Tiffany, III .................. 235/488 |
| 6,294,825 B1 * | 9/2001 | Bolken et al. ............... 257/676 |

OTHER PUBLICATIONS

John H. Lau (Editor), Chip on Board Technologies for Multichip Modules; 1994, pp. 2, 3, 24–27, 30–33, 330–337; Van Nostrand Reinhold, an International Thomson Publishing Company.

John H. Lau, Shi–Wei Ricky Lee, Chip Scale Package (CSP); pp. vii–xvi, 1, 2, 43, 61, 91, 87, 97, 107, 129, 143, 157, 173, 183, 201, 219, 233, 259, 283, 293, 305, 313, 337, 349, 359, 377, 399, 407, 429, 439, 455, 467, 477, 487, 495, 519, 529, 545; McGraw–Hill Publishing Company.

* cited by examiner

*Primary Examiner*—Anthony Dinkins
*Assistant Examiner*—Carmelo Oliva
(74) *Attorney, Agent, or Firm*—Thorp Reed & Armstrong, LLP

(57) ABSTRACT

A method of encapsulating an article having first and second surfaces, includes positioning a first molding section in a sealing relationship with the first surface of the article and positioning a second molding section adjacent the second surface of the article. The first molding section is filled first thereby forcing the second surface of the article into a sealing engagement with the second molding section. The second molding section is then filled.

8 Claims, 6 Drawing Sheets

ASYMMETRIC TRANSFER MOLDING METHOD AND AN ASYMMETRIC ENCAPSULATION MADE THEREFROM

This application is a continuation of prior U.S. application Ser. No. 09/388,045 filed Sep. 1, 1999, now U.S. Pat. No. 6,605,331, which is a divisional of prior U.S. application Ser. No. 09/255,554, now U.S. Pat. No. 6,143,581, filed Feb. 22, 1999.

BACKGROUND OF THE INVENTION

1. Field of the Invention

The invention relates to a method of encapsulating an article and, more specifically, to transfer molding an asymmetric encapsulation for an electronic device, and an asymmetric encapsulated electronic device.

2. Description of the Background

It is well known that electronic devices are sensitive and thus require protection from physical and environmental conditions which may degrade or completely ruin them. Therefore, it is well known in the art to protect electronic devices from these conditions by sealing them with a protective encapsulation material. This "packaging" of the electronic devices protects them from the conditions which may degrade them and allows the devices to be transported and handled, and thus allows them to be easily configured with other components. Several encapsulation methods are known in the art such as under-fill encapsulation (for flip chip applications) and glob topping.

One prior-art method for encapsulating devices is the "transfer-molding" method. Transfer molding is a process through which an encapsulating material, such as a thermo-setting material, is caused to flow into a cavity formed by components of a mold. The thermosetting material enters into the cavity and flows over the electronic device[s] that is[are] located within the cavity and is then "cured" so that the resin hardens into a non-flowable state. Traditionally it has been important to control the flow of the material into the cavity for a number of reasons, including: to provide void-free fill over the electrical device, to control the flow of the material so as to not contaminate unwanted areas with the encapsulating material, and to control the flow of the material so as to not cause any wire displacement or other damage to the assembly.

Also, it is well known in the art to use mechanical clamping mechanisms as sealing devices in conjunction with the molding cavity to attempt to contain the thermosetting resin within the cavity prior to curing. However, because mechanical clamps must be applied in a symmetrical fashion, i.e. equal and opposite clamping forces, the configuration of the molds is limited to symmetrical designs.

Therefore there is a need for an improved encapsulation method for transfer molding electronic devices which provides a leak proof sealing mechanism for asymmetric designs while using current equipment and known materials and techniques.

SUMMARY OF THE INVENTION

In accordance with one aspect of the present invention, a method of encapsulating an article having first and second surfaces includes the following steps: positioning a first molding section in a sealing relationship with the first surface of the article; positioning a second molding section adjacent the second surface of the article; filling the first molding section thereby forcing the second surface of the article into a sealing engagement with the second molding section; and filling the second molding section. Additionally, the step of filling the first and second molding sections may include the step of filling the first and second molding sections with an encapsulating material chosen from a class consisting of epoxies (including thermo-set resins), silicones, sycar, polyimides, and polyurethanes. Also, depending on the type of encapsulating material that is chosen, an optional step of curing the encapsulating material may be required.

Another aspect of the present invention is to provide a method which includes the following steps: mounting an electrical device to a first surface of a flexible substrate such that leads from the electrical device extend to a second surface of the flexible substrate; connecting the leads to traces formed in the second surface of the flexible substrate; positioning a portion of the flexible substrate carrying the electrical device within a molding cavity defined by first and second molding sections, the substrate forming a seal with the first molding section; forming a seal between the substrate and the second molding section by filling the first molding section; and filling the second molding section.

Another aspect of the present invention is to provide a method of transfer molding, including the steps of: positioning a first portion of encapsulated material on a first surface by transfer molding; and positioning a second portion of encapsulated material, of smaller surface area than the first portion, on a second surface by transfer molding.

Another aspect of the present invention is to provide a mold, which includes: a first molding section and a second molding section. The first and second molding sections form a cavity for receiving an article to be encapsulated. The surface area of a first side of an article exposed to the cavity is greater than the surface area of a second side of the article exposed to the cavity. At least one gate for injecting encapsulating material into the cavity is provided.

Another aspect of the present invention is to provide a non-symmetrical, transfer molded, encapsulated article.

The present invention provides several advantages over prior art techniques. Yields are increased in comparison to parts which are glob topped. The method of the present invention may be carried out using existing processes and materials having well known and understood properties. Additionally, existing molding equipment may be used. Assembly throughput is increased. Those advantages and benefits, and others, will be apparent to those of ordinary skill in the art from the Description of a Preferred Embodiment, herein below.

BRIEF DESCRIPTION OF THE DRAWINGS

For the present invention to be readily understood and practiced, the invention will now be described, for purposes of illustration and not limitation, in conjunction with the following figures wherein.

DETAILED DESCRIPTION OF A PREFERRED EMBODIMENT

Figure 1:
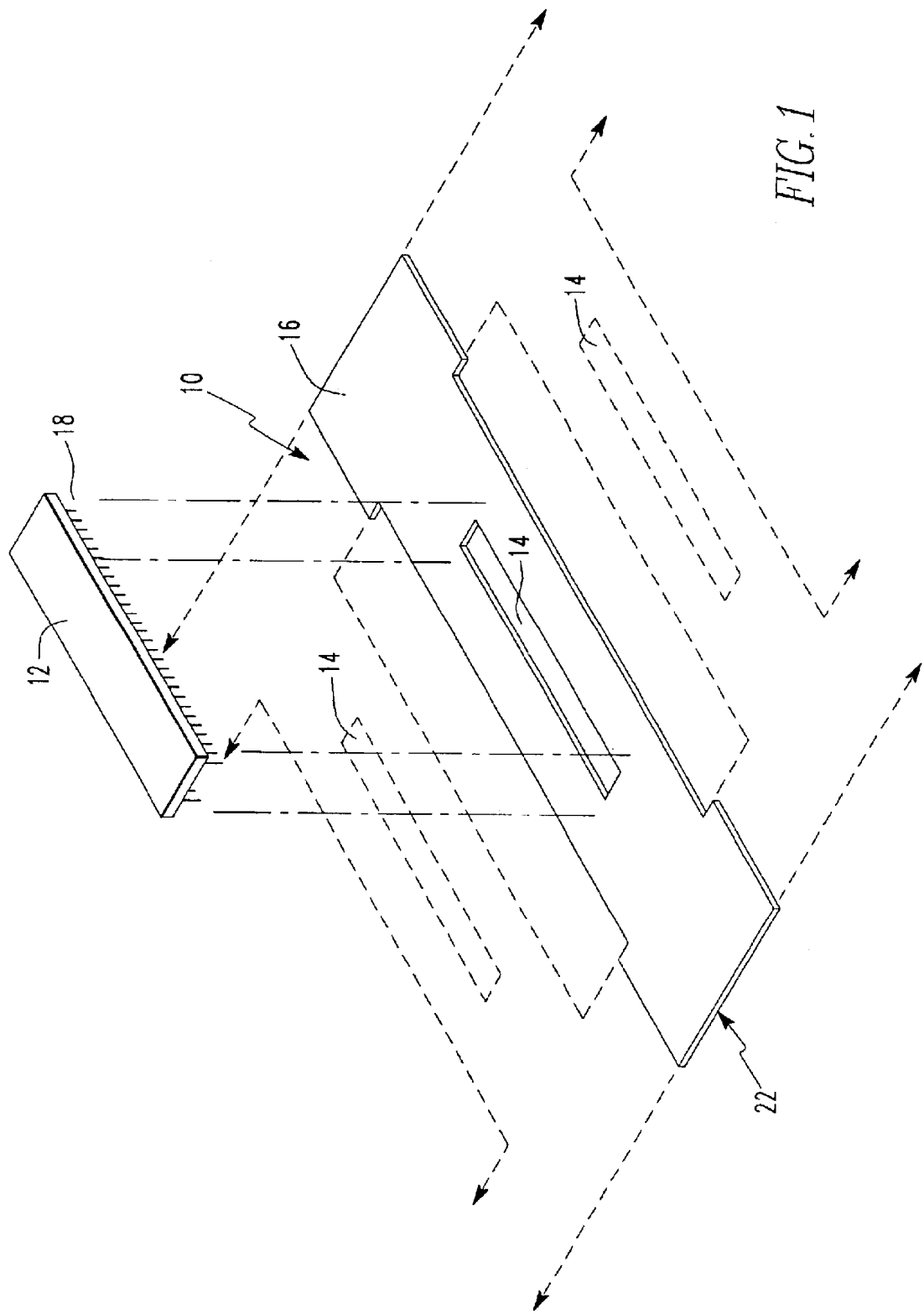
FIG. 1 illustrates a substrate which may be used in conjunction with the method of the present invention.

FIG. 1 illustrates a substrate 10 which may be used in conjunction with the method of the present invention. The description of the method of the present invention in connection with the substrate 10 is for purposes of illustration only, and not limitation. It is anticipated that the method and molds of the present invention may be used to encapsulate a large variety of articles, both electrical and non-electrical. In FIG. 1, the substrate is a known flexible substrate suitable for receiving electrical devices 12 in openings 14. The electrical device may be any type of device, although a memory device is shown in FIG. 1.

The electrical device 12 may be connected to a first side 16 of the substrate 10 by any known means, e.g. lamination, adhesion, etc. The device 12 may be of a type in which electrical connections extend from the center of the device. The device 12 is positioned such that the electrical connections 18 of the device 12 extend through opening 14 to a second side 20 of substrate 10, seen in FIG. 3. In the remaining pre-singulation figures, only portion 22 of substrate 10 is illustrated for purposes of convenience. The reader will recognize that the description of the method and molds hereinafter with respect to portion 22 is actually carried out "x" times, e.g., 8, 10, 12, etc. depending upon the size and capacity of the encapsulating equipment.

Figure 2:
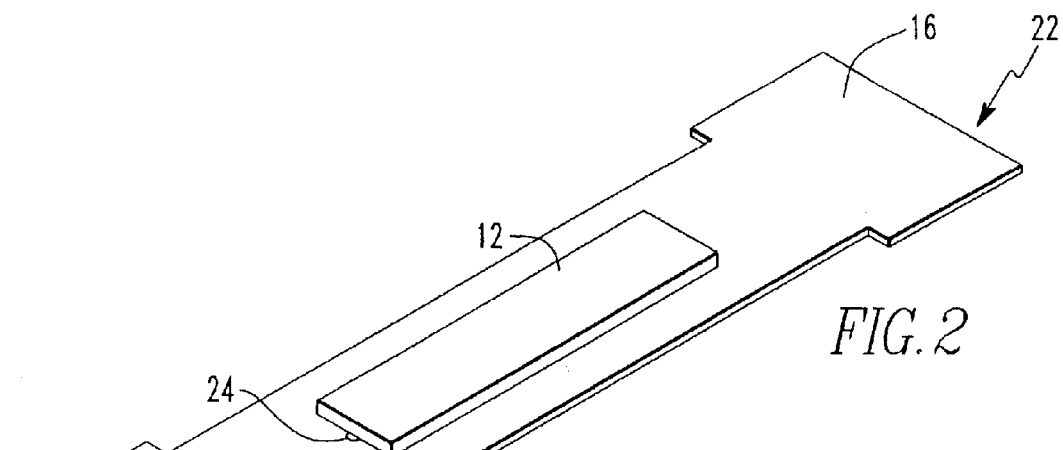
FIG. 2 illustrates a portion of the substrate of FIG. 1 carrying an electrical device to be encapsulated.

In FIG. 2 it is seen that the device 12 is positioned such that opening 14 is not completely blocked leaving a small opening referred to as a secondary gate 24. If the device 12 completely blocks opening 14, then an alternate means of providing encapsulating material must be provided as described below.

Figure 3:
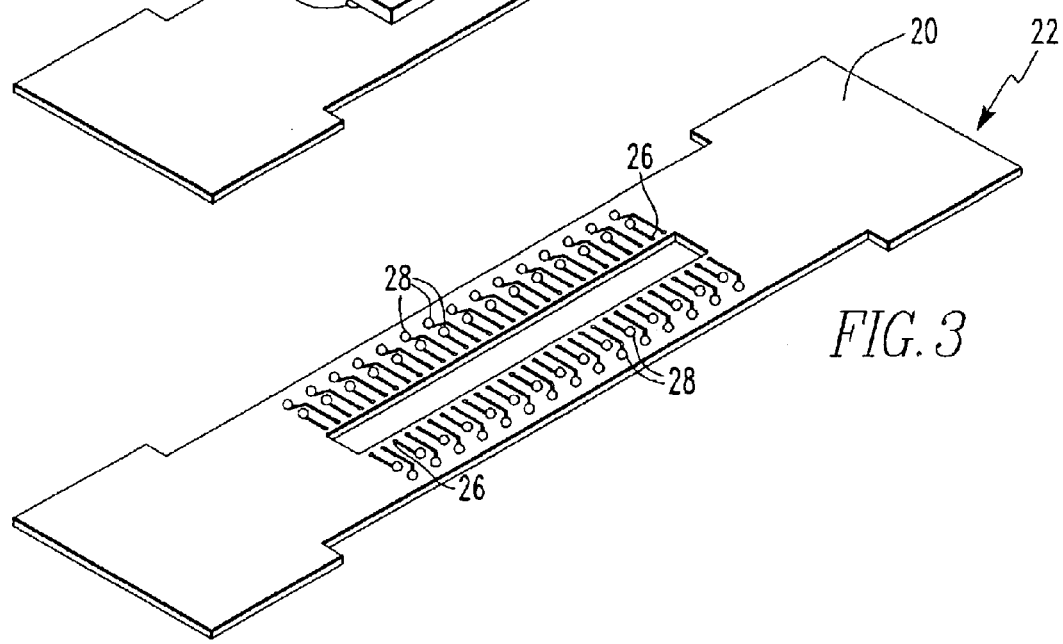
FIG. 3 illustrates the opposite side of the substrate illustrated in FIG. 2.

In FIG. 3, the second side 20 of the portion 22 of the substrate 10 is illustrated. Second side 20 has traces 26 formed therein. The traces 26 may be formed using a solder masking step as is known in the art. Solder balls 28 may be embedded in portion 22 to provide a termination/connection point for each of the traces 26. After the device 12 is connected to the portion 22 and the electrical connections 18 are extending through opening 14, each electrical connection 18 is connected to one of the traces using any known connection technique and machinery.

Figure 4:
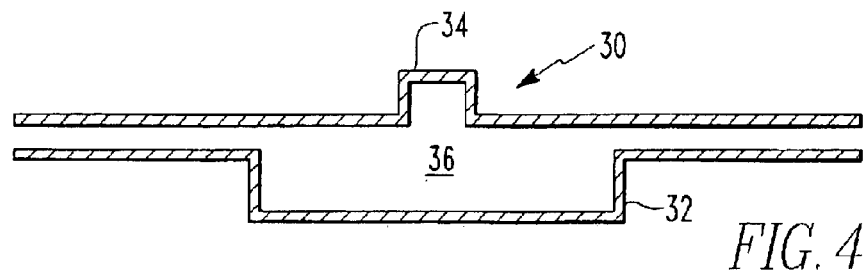
FIG. 4 illustrates first and second mold sections which define a mold cavity.

A mold 30 which may be used in conjunction with the method of the present invention is illustrated in FIG. 4. In FIG. 4, a first mold section 32 and a second mold section 34 cooperate to define a mold cavity 36.

Figure 5:
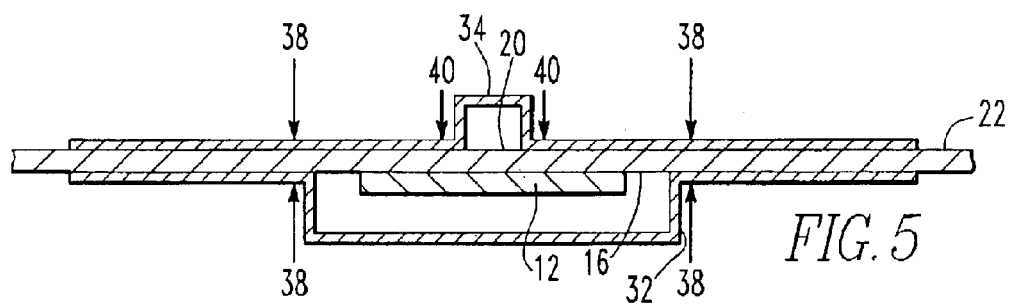
FIG. 5 illustrates the portion of the substrate shown in FIGS. 2 and 3 positioned in the mold cavity.

FIG. 5 illustrates the portion 22 positioned within cavity 36. The portion 22 is positioned such that device 12 is entirely within the portion of the cavity 36 formed by the first mold section 32, although, for other devices that may not be the case. Similarly, opening 14, and the connection of the electrical connections 18 to traces 26 is positioned entirely within the portion of the cavity 36 formed by the second mold section 34.

The asymmetry of the mold sections 32, 34 can be clearly seen in FIGS. 4 and 5. In this illustrated embodiment, the surface area of the mold section 32 is approximately three times greater than a surface area of the mold section 34. Generally, the surface area (A16) of the first side 16 of portion 22 facing mold cavity 36 must be greater than the surface area (A20) of the second side 20 of portion 22 facing mold cavity 36. That is A16>A20.

Another by-product of the asymmetry is that first mold portion 32 may be sealed against the first surface 16 of portion 22 by applying clamping pressure in the four areas marked 38. No such seal can be formed at this time between second mold portion 34 and the second surface 20 of portion 22 because no clamping pressure can be exerted in opposition to the two areas marked 40. Not shown in FIGS. 4 and 5 is a runner and primary gate, which is the mechanism for injecting the encapsulating material into the portion of the mold cavity formed by the first mold section 32.

Figure 6:
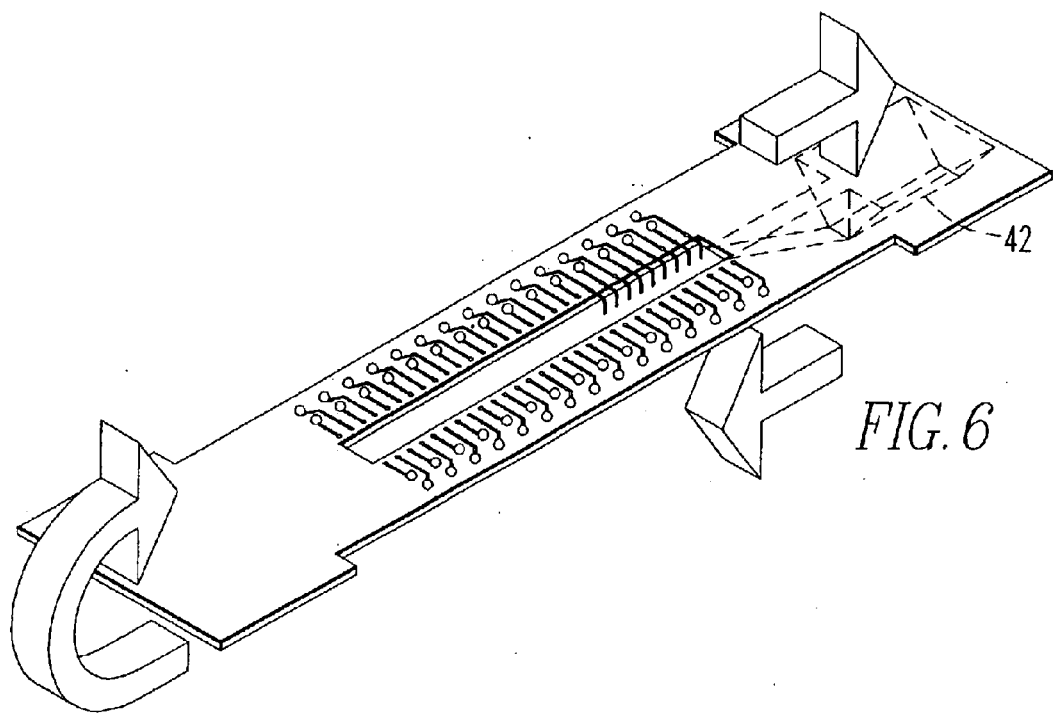
FIG. 6 illustrates the sequence of filling the mold cavity.

Turning now to FIG. 6, the sequential flow of encapsulating material into the mold cavity 34 is shown. Encapsulating material flows under pressure through runner 42 into the portion of the mold cavity formed by first mold section 32. The pressure in runner 42 is designated P1 while the pressure in the portion of the mold cavity formed by first mold section 32 is designated P2. The encapsulating material passes through secondary gate 24 at a pressure of P3 and into the portion of the mold cavity formed by second mold section 34 at a pressure of P4. The pressure is controlled such that P1>P2>P3>P4.

In one embodiment, the encapsulation material is a thermo-set epoxy resin mixture and may be loaded under a pressure in the range of 500–2000 psi. Fill times when the encapsulation material is a thermo-set epoxy resin mixture are on the order of 3–10 seconds. The injection pressure and fill times are dependent upon the specific encapsulating material that is used.

As the encapsulation material fills the portion of the mold cavity formed by the first mold section 32, the portion 22 of the substrate 10 bends or flexes under the pressure exerted by the encapsulation material. The bending brings the second surface 20 into a sealing engagement with the second molding section 34. Thus, a seal is dynamically formed as a portion of the mold cavity formed by the first mold section 32 is filled. In low-pressure applications, it is anticipated that a force may be exerted to cause the bending to take place.

The encapsulation material may be chosen from a class consisting of epoxies (including thermo-set resins), silicones, sycar, polyimides, and polyurethanes. These encapsulation materials are suitable for use when encapsulating electronic components because they have low moisture permeability, high mobile ions barriers, good UV-VIS and alpha particle protection, favorable mechanical, electrical and physical properties, as well as a low dielectric constant to reduce the device propagation delay and high thermal conductivity to dissipate heat generated by the devices. The proper choice of encapsulation material can enhance reliability of the device and improve its mechanical and physical properties. An optional curing step may hereinafter be required, depending upon the choice of encapsulation material, followed by removal of the mold sections 32, 34.

Figure 7:
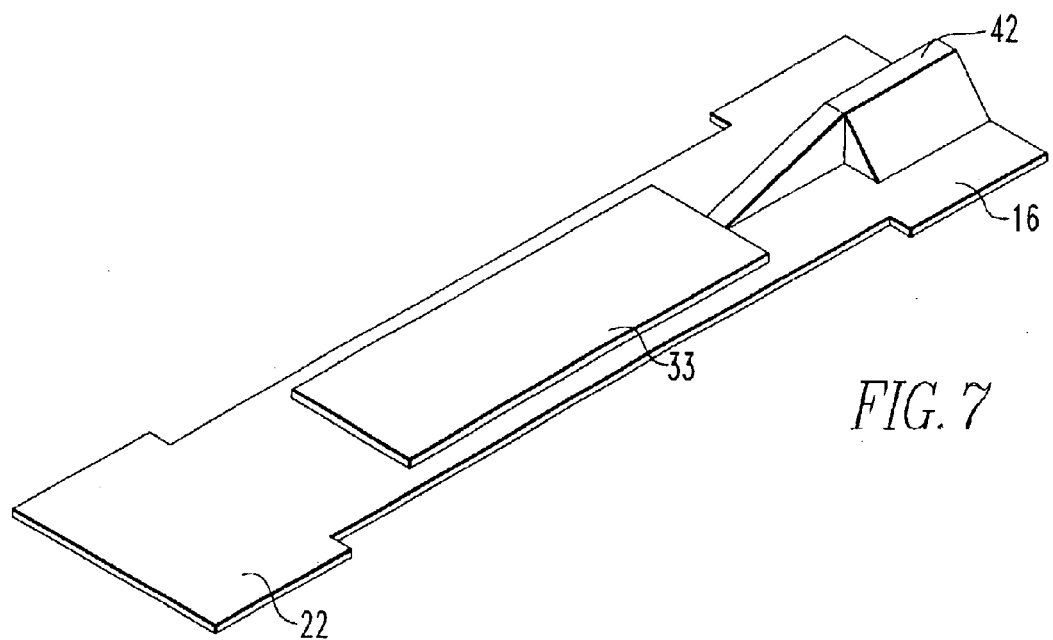
FIGS. 7 and 8 are perspective and plan views, respectively, of a first side of the portion of the substrate illustrated in FIGS. 2 and 3, after encapsulation.
Figure 8:
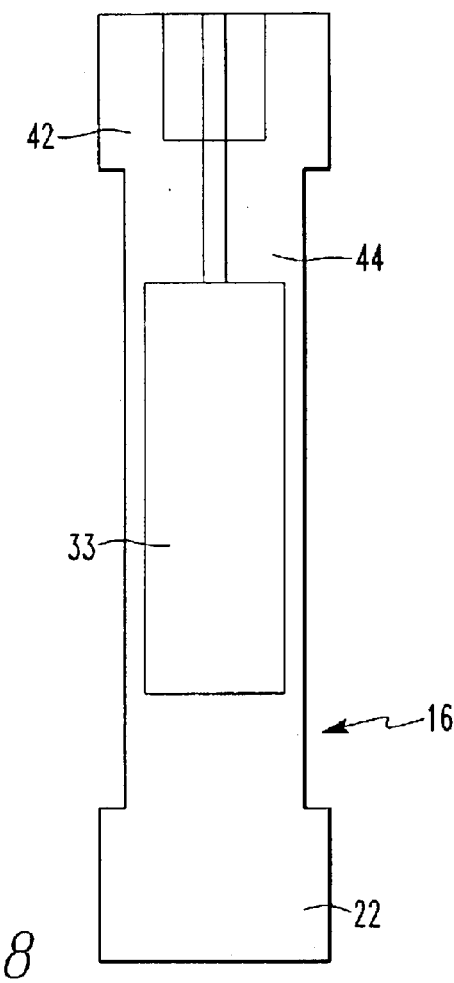
Figure 9:
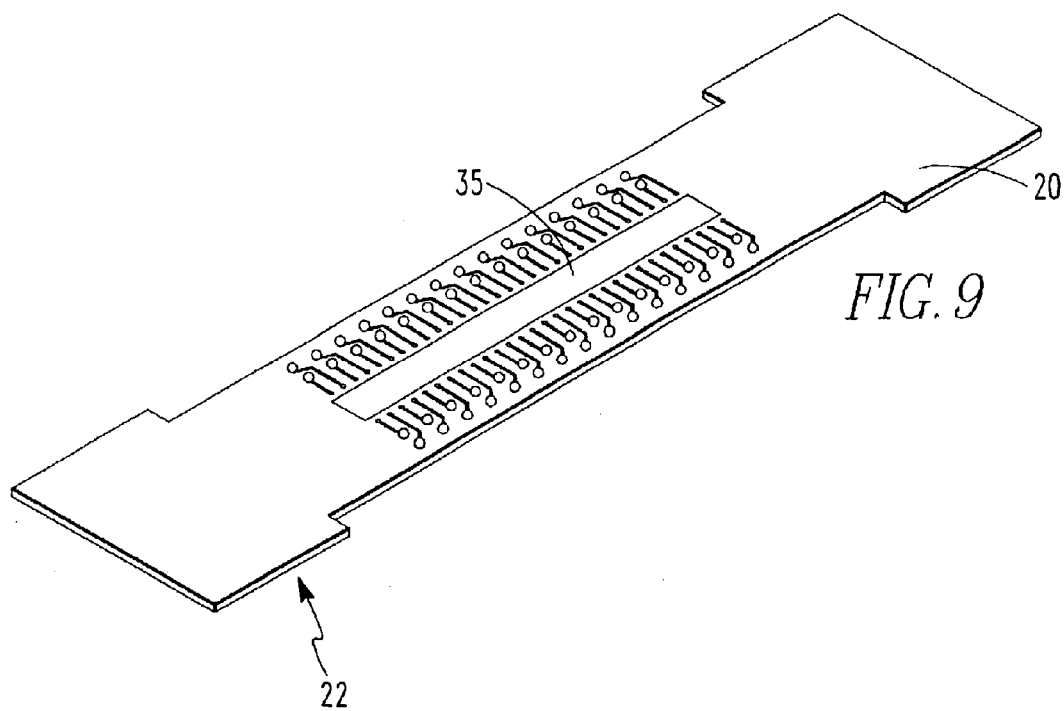
FIGS. 9 and 10 are perspective and plan views, respectively, of a second side of the portion of the substrate illustrated in FIGS. 2 and 3, after encapsulation.
Figure 10:
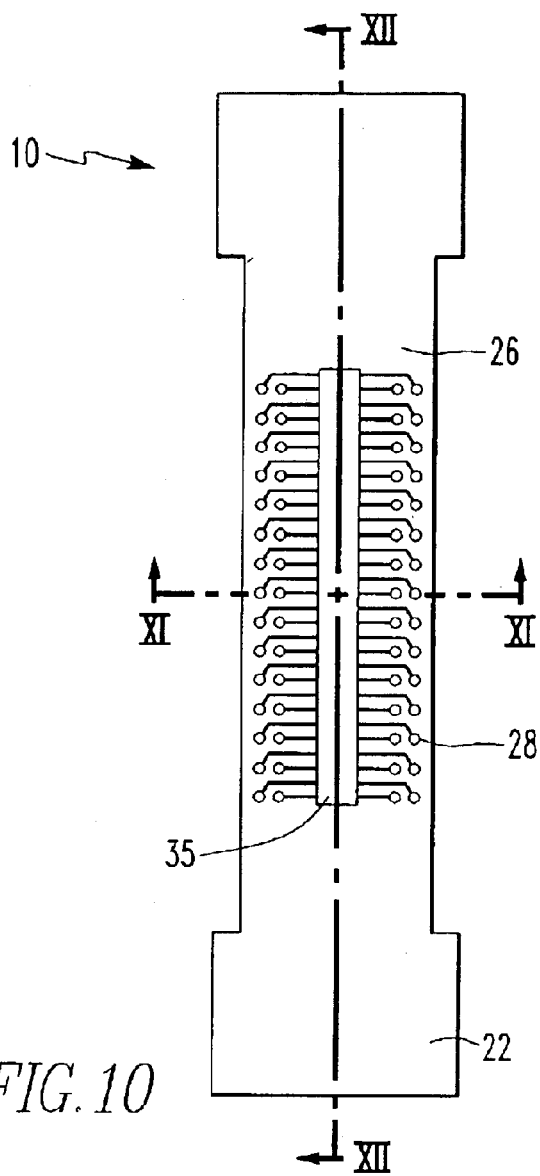

After the mold sections 32, 34 are removed, the encapsulated electronic device appears as shown in FIGS. 7, 8, 9, and 10. FIGS. 7 and 8 show the first side 16 of portion 22 after removal of mold section 32. A first portion of encapsulated material 33 is formed as a result of the encapsulation material being loaded into mold section 32. FIGS. 9 and 10 show the second side 20 of portion 22 after removal of mold section 34. A second portion of encapsulated material 35 is formed as a result of the encapsulation material being loaded into mold section 34.

Figure 12:
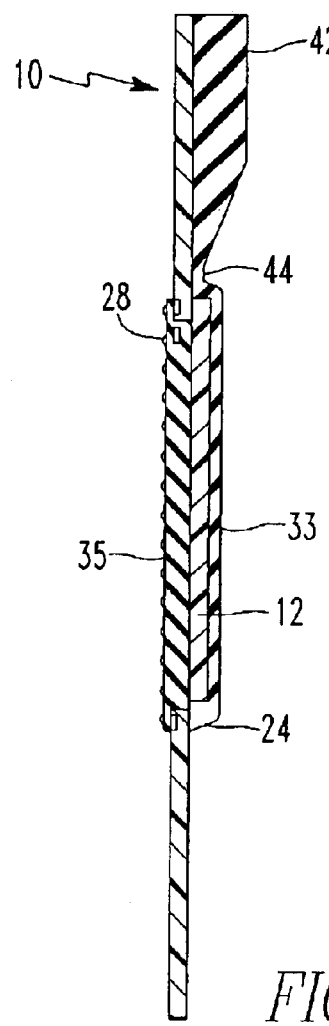
FIGS. 11 and 12 are views taken along the lines XI and XII, respectively, in FIG. 10.
Figure 11:
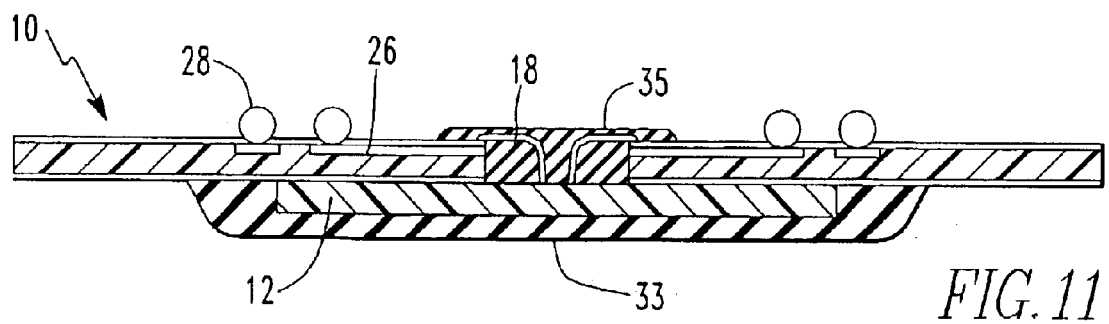

FIGS. 11 and 12 illustrate views taken along the lines XI and XII, respectively, in FIG. 10. FIG. 12 provides a view of runner 42 and primary gate 44, which is the mechanism for injecting the encapsulation material into the portion of the mold cavity formed by the first mold section 32.

Figure 13A:
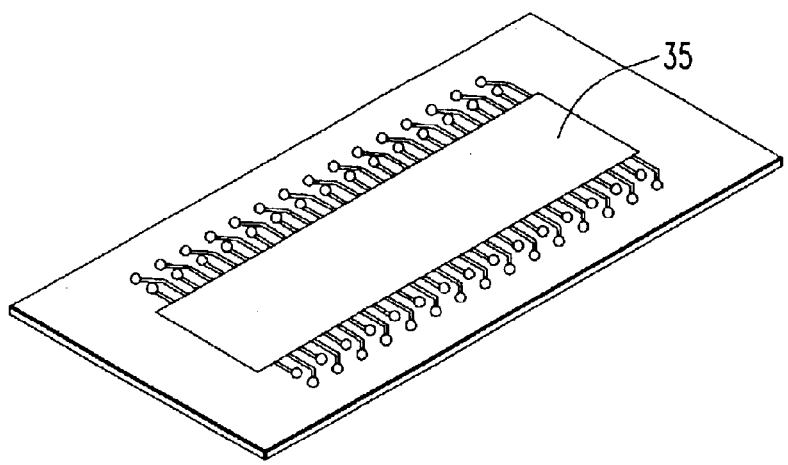
FIGS. 13A and 13B illustrate an asymmetric encapsulated device.
Figure 13B:
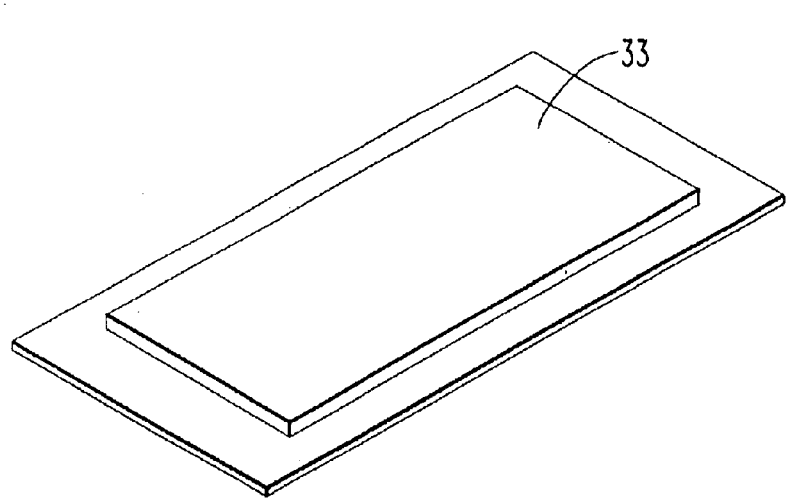

FIGS. 13A and 13B show the final product of the present invention after singulation, i.e. after portions of the substrate 22 are separated and the runner 42 is removed.

Figure 14:
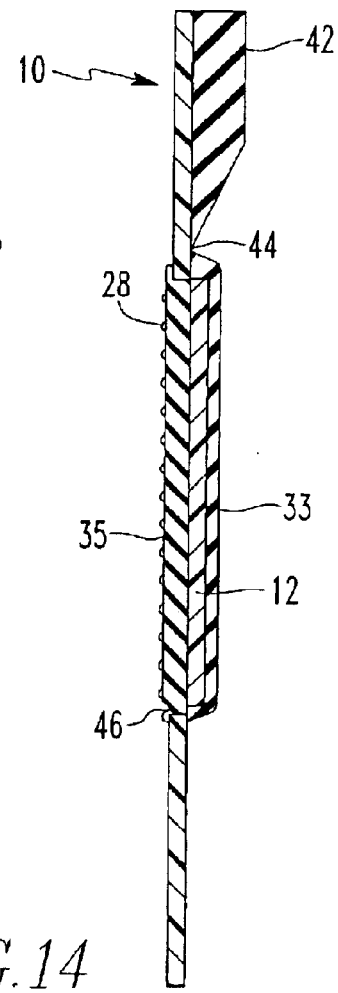
FIG. 14 illustrates another gate arrangement which may be used with the method of the present invention.

FIG. 14 shows another gate arrangement which may be used with the method of the present invention. The electrical device to be encapsulated is a memory device identical to the one as shown in previous FIGS. 1 through 13B, although the electrical device may be any type of device. The electrical device 12 is positioned such that opening 14 (see FIG. 1) is completely blocked. Thus encapsulating material injected into first mold section 32 from runner 42 and primary gate 44 is contained within first mold section 32. That is, there is no connecting gate between first mold section 32 and second mold section 34 through which encapsulation material may flow. Encapsulating material may be injected directly into mold section 34 through a gate 46 and a runner, not shown. The encapsulating material injected into mold section 34 is contained within mold section 34.

While the present invention has been described in conjunction with preferred embodiments thereof, those of ordinary skill will recognize that many modifications and variations thereof are possible. For example, a limitless number of asymmetric mold designs are possible. It is anticipated that the method of the present invention may be carried out using a variety of encapsulating materials and commercially available injection molding machines. Also, numerous other gate configurations are possible. The foregoing description and the following claims are intended to cover all such modifications and variations.

What is claimed is:

1. A system comprising:
a flexible substrate;
a device mounted upon said substrate; and
an asymmetrical mold, said mold comprising:
a first molding section;
a second molding section, said first and second molding sections forming a cavity for receiving at least a portion of said flexible substrate carrying said device; said cavity comprising a first defined by said first molding section and a second cavity defined by said section molding section; said cavity designed such that a first surface area of the device exposed to said first cavity is greater than a second surface area of the device exposed to said second cavity;
a first gate operatively connected to said first cavity for injecting encapsulating material into said first cavity; and
a second gate at a separate location from the location of said first gate and operatively connecting said second cavity to said first cavity.

2. The system of claim 1 designed to withstand a psi of approximately 500–2000 psi and a filling time of approximately 3–10 seconds.

3. The system of claim 1 wherein said device is an electrical device.

4. The system of claim 1 wherein said device is a memory device.

5. A system comprising:
a flexible substrate;
a device mounted upon said substrate; and
an asymmetrical mold, said mold comprising:
a first molding section;
a second molding section, said first and second molding sections forming a cavity for receiving at least a portion of said flexible substrate carrying said device; said cavity comprising a first cavity defined by said first molding section and a second cavity defined by said section molding section; said cavity designed such that a first surface area of the device exposed to said first cavity is greater than a second surface area of the device exposed to said second cavity;
a first gate operatively connected to said first cavity for injecting encapsulating material into said first cavity; and
a second gate operatively connected to said second cavity for injecting encapsulating material into said second cavity;
wherein said first and second gates are configured for sequential operation.

6. The system of a claim 5 designed to withstand a psi of approximately 500–2000 psi and a filling time of approximately 3–10 seconds.

7. The system of a claim 5 wherein said device is an electrical device.

8. The system of claim 5 wherein said device is a memory device.

* * * * *

UNITED STATES PATENT AND TRADEMARK OFFICE
CERTIFICATE OF CORRECTION

PATENT NO. : 6,951,981 B2 Page 1 of 1
APPLICATION NO. : 10/321977
DATED : October 4, 2005
INVENTOR(S) : Mark S. Johnson et al.

It is certified that error appears in the above-identified patent and that said Letters Patent is hereby corrected as shown below:

Column 6, Line 1, after "first" insert --cavity--.

Signed and Sealed this

Twenty-second Day of May, 2007

JON W. DUDAS
*Director of the United States Patent and Trademark Office*